(12) United States Patent
Lawas

(10) Patent No.: US 8,502,567 B2
(45) Date of Patent: Aug. 6, 2013

(54) APPARATUS AND METHOD FOR PROTECTING A SEMICONDUCTOR JUNCTION

(75) Inventor: Kenneth Lawas, Kensington, NH (US)

(73) Assignee: Analog Devices, Inc., Norwood, MA (US)

( * ) Notice: Subject to any disclaimer, the term of this patent is extended or adjusted under 35 U.S.C. 154(b) by 267 days.

(21) Appl. No.: 12/787,318

(22) Filed: May 25, 2010

(65) Prior Publication Data

US 2011/0291749 A1 Dec. 1, 2011

(51) Int. Cl.
*H03B 1/00* (2006.01)

(52) U.S. Cl.
USPC .......................................... 327/108

(58) Field of Classification Search
USPC .................................. 327/108–112
See application file for complete search history.

(56) References Cited

U.S. PATENT DOCUMENTS

| | | | |
|---|---|---|---|
| 6,844,768 B2 | 1/2005 | Bankman et al. | |
| 2010/0208399 A1* | 8/2010 | Yu et al. | 361/56 |

OTHER PUBLICATIONS

Analog Devices, 750 MHz, 16 × 16, Analog Crosspoint Switch, ADV3226/ADV3227, Analog Devices, Inc., available at http://www.analog.com/static/imported-files/data_sheets/ADV3226_3227.pdf, Apr. 2010.
Analog Devices, 800 MHz, 2:1 Analog Multiplexers, ADV3219/ADV3220, Analog Devices, Inc., available at www.analog.com/static/imported-files/data_sheets/ADV3219_3220.pdf, Apr. 2010.
Analog Devices, 800 MHz, 2:1 Analog Multiplexer, ADV3221/ADV3222, Analog Devices, Inc., available at www.analog.com/static/imported-files/data_sheets/ADV3221_3222.pdf, Mar. 2010.
Analog Devices, Audio/Video 60 MHz, 16 × 16, G= +2 Crosspoint Switch, AD8113, Analog Devices, Inc., available at www.analog.com/static/imported-files/data_sheets/AD8113.pdf, May 2003.
Analog Devices, Low Cost 225 MHz, 16 × 16 Crosspoint Switches, AD8114/AD8115, 2010, Analog Devices, Inc., available at www.analog.com/static/imported-files/data_sheets/AD8114_8115.pdf, Sep. 2005.

\* cited by examiner

*Primary Examiner* — Daniel Rojas
(74) *Attorney, Agent, or Firm* — Knobbe Martens Olson & Bear LLP

(57) ABSTRACT

Apparatus and methods are disclosed, such as those involving protection of a semiconductor junction of a semiconductor device. One such apparatus includes a bipolar transistor including an emitter, a base, and a collector; a first junction protection device including a first end electrically coupled to the emitter of the bipolar transistor, and a second end electrically coupled to a node; and a second junction protection device including a first end electrically coupled to a voltage reference, and a second electrically coupled to the emitter of the bipolar transistor. Each of the first and second junction protection devices may have a substantially higher leakage current than the leakage current of the base-emitter junction of the bipolar transistor when reverse biased.

29 Claims, 10 Drawing Sheets

Forward Bias
$V_B > V_E$

Reverse Bias
$V_B < V_E$

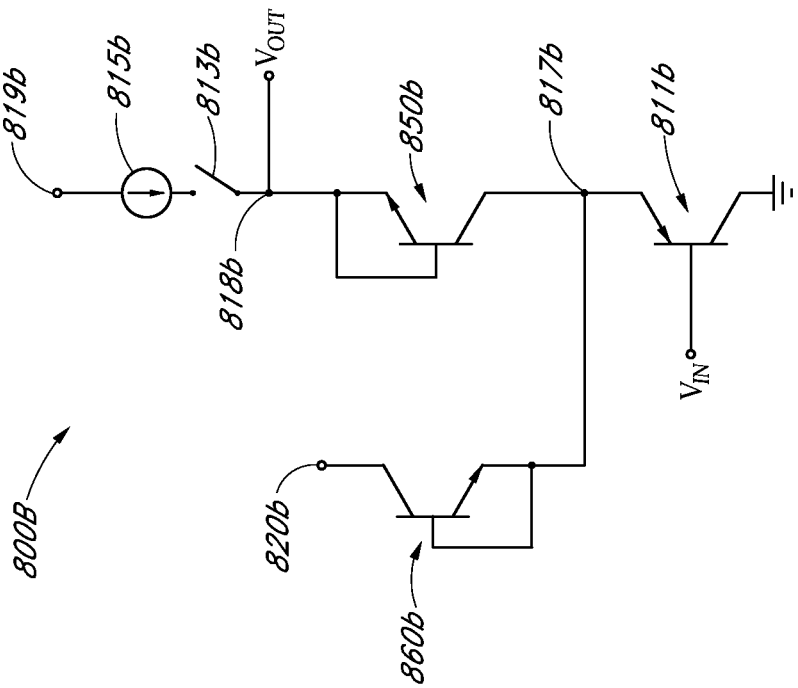
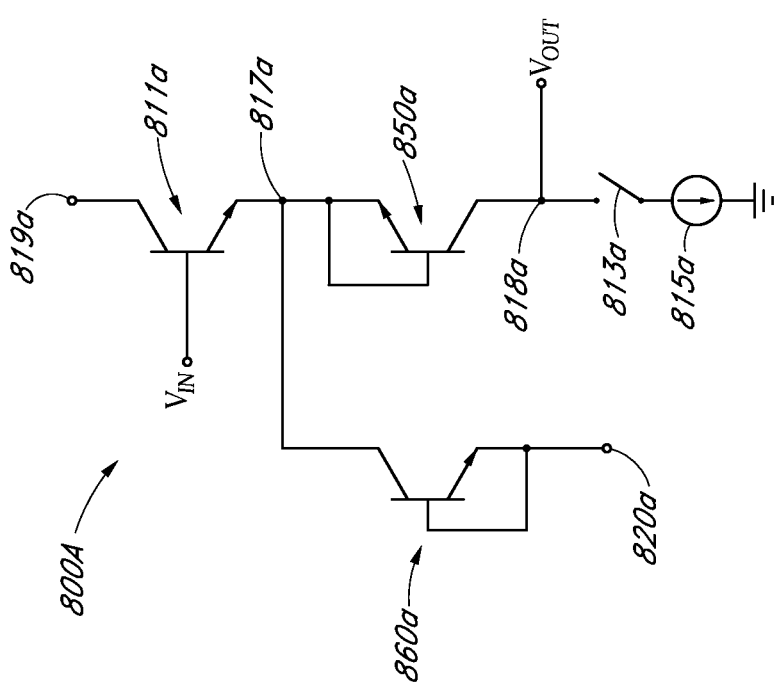
FIG. 8B
FIG. 8A

US 8,502,567 B2

APPARATUS AND METHOD FOR PROTECTING A SEMICONDUCTOR JUNCTION

BACKGROUND

1. Field

Embodiments of the invention relate to electronic devices, and more particularly, in one or more embodiments, to protection of a semiconductor junction.

2. Description of the Related Technology

Many electronic devices employ semiconductor devices having a semiconductor junction. One example of such semiconductor devices is a bipolar transistor that has p-n junctions. A bipolar transistor can be used for various applications, such as signal amplification or switching.

A bipolar transistor has a base-emitter junction that is typically designed to be forward-biased during normal operation. In some instances when a bipolar transistor is used in switching applications, a reverse bias voltage can be applied across the base-emitter junction.

Bipolar transistors made by modern processes have a relatively small structure and cannot withstand very much reverse bias voltage without a permanent degradation in performance. Yet, bipolar transistors can be used to process large signal swings in certain applications. Such bipolar transistors can be damaged by reverse bias condition caused by the large signal swings. As such, there is a need for protection of a semiconductor junction from reverse bias in certain instances.

SUMMARY

In one embodiment, an apparatus includes: a bipolar transistor comprising an emitter, a base, a collector; and a first junction protection device having a first end and a second end, wherein the first end is electrically coupled to the emitter of the bipolar transistor, and wherein the second end is electrically coupled to a node other than the base of the bipolar transistor. The apparatus also includes a second junction protection device having a first end and a second end, wherein the first end is electrically coupled to a voltage reference, and the second end is electrically coupled to the emitter of the bipolar transistor. The first and second junction protection devices have substantially higher leakage currents than the leakage current of a base-emitter junction of the bipolar transistor when each is reverse biased.

In another embodiment, an electronic device includes: a plurality of circuits connected in parallel to one another. Each of the circuits comprises: a first bipolar transistor including an emitter, a base, and a collector; a first junction protection device including a first end electrically coupled to the emitter of the first bipolar transistor, and a second end electrically coupled to a node; and a second junction protection device including a first end electrically coupled to a first voltage reference, and a second end electrically coupled to the emitter of the first bipolar transistor. Each of the first and second junction protection devices has a substantially higher leakage current than the leakage current of a p-n junction of the first bipolar transistor when reverse biased.

In yet another embodiment, a method includes: applying a first voltage to a first node, and a second voltage to a second node, thereby reverse-biasing a p-n junction of a semiconductor device electrically coupled between the first and second nodes; generating a first leakage current through a first junction protection device electrically coupled between the first node and the p-n junction, wherein the first leakage current is substantially higher than a leakage current through the p-n junction; and generating a second leakage current through a second junction protection device electrically coupled between the p-n junction and a voltage reference, wherein the second leakage current is substantially higher than the leakage current through the p-n junction.

BRIEF DESCRIPTION OF THE DRAWINGS

FIG. 8A is a circuit diagram of a circuit including an NPN bipolar transistor and diode-connected bipolar transistors for junction protection of the transistor according to yet another embodiment.

FIG. 8B is a circuit diagram of a circuit including a PNP bipolar transistor and diode-connected bipolar transistors for junction protection of the transistor according to yet another embodiment.

DETAILED DESCRIPTION OF EMBODIMENTS

Figure 1A:
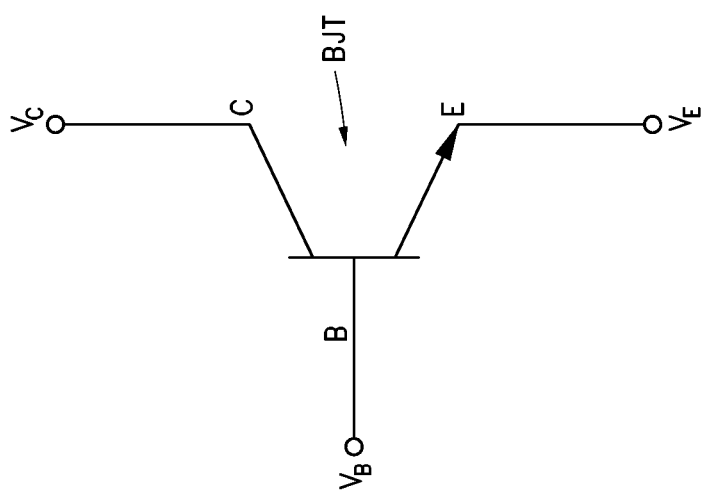
FIG. 1A illustrates a bipolar transistor with its base-emitter forward-biased.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Bipolar Transistor Operations

Figure 1B:
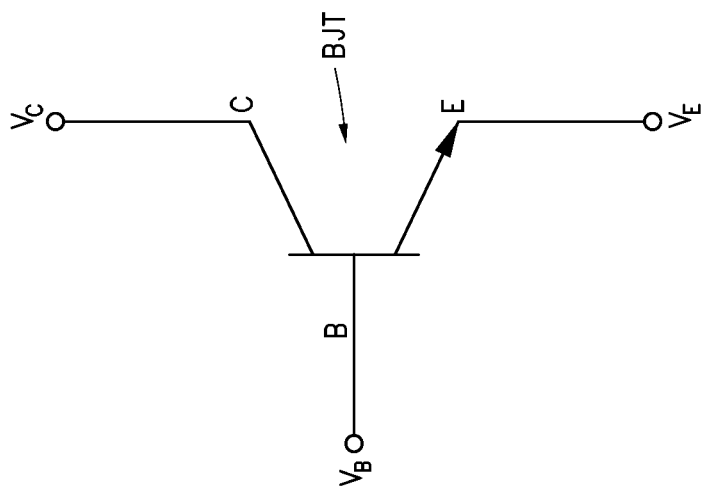
FIG. 1B illustrates a bipolar transistor with its base-emitter reverse-biased.
Figure 2:
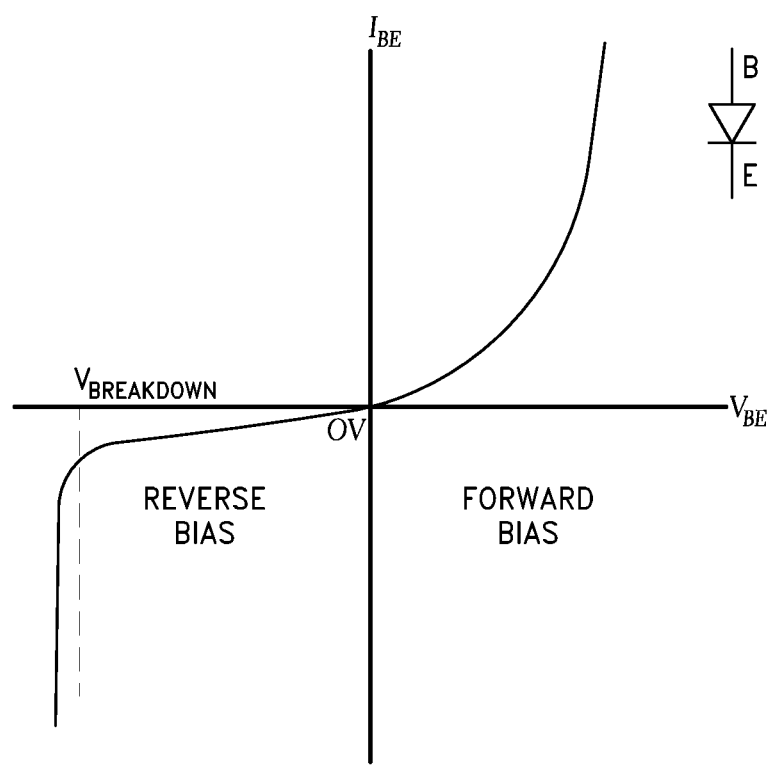
FIG. 2 is a graph illustrating a relationship between the base-emitter bias voltage (x-axis) and the base-emitter current (y-axis) of an NPN bipolar transistor.

Referring to FIGS. 1A, 1B, and 2, the operation of a bipolar transistor will be described below. As well-known to skilled artisans, a bipolar transistor (or bipolar junction transistor) is a three-terminal electronic device including doped semiconductor material. In a bipolar transistor, charge flows due to bidirectional diffusion of charge carriers across a junction between two regions of different charge concentrations.

FIG. 1A shows an NPN bipolar transistor BJT, which includes a base B provided with a base voltage $V_B$, an emitter E provided with an emitter voltage $V_E$, and a collector C having a collector voltage $V_C$. The NPN bipolar transistor BJT can be considered as two diodes with a shared node. Thus, the base B and the emitter E can be considered as forming a diode, and the base B and the collector C can be considered as forming another diode.

In a typical operation, a junction between the base B and the emitter E (hereinafter, referred to as a "base-emitter junction") is forward-biased with the base voltage $V_B$ being higher than the emitter voltage $V_E$ (or the base-emitter voltage $V_{BE}$ being greater than 0V), as shown in FIGS. 1A and 2. When the NPN bipolar transistor BJT is forward-biased, holes inject from the base B of the transistor BJT into the emitter E, which are compensated by an equal number of electrons taken from the total electrons injected from the emitter E into the base B. This generates a base-emitter current $I_{BE}$ flowing from the base B to the emitter E. A relationship between the base-emitter voltage $V_{BE}$ and the base-emitter current $I_{BE}$ during forward-bias is shown in the right half of the graph of FIG. 2.

In certain instances, the base-emitter junction is reverse-biased with the base voltage $V_B$ being lower than the emitter voltage $V_E$ (or the base-emitter voltage $V_{BE}$ being lower than 0 V), as shown in FIGS. 1B and 2. When the NPN bipolar transistor BJT is reverse-biased, a small number of electrons leak from the base B of the transistor BJT into the emitter E of the transistor BJT, thereby generating a leakage current $I_{BE}$ flowing from the emitter E to the base B. When the base-emitter voltage $V_{BE}$ is lower than a breakdown voltage $V_{BREAKDOWN}$, avalanche breakdown can occur at the base-emitter junction such that a very large current flows from the emitter E to the base B (in certain bipolar transistors, the emitter-base breakdown mechanism may be Zener breakdown). A relationship between the base-emitter voltage $V_{BE}$ and the base-emitter current $I_{BE}$ during reverse-bias is shown in the left half of the graph of FIG. 2. Operation of bipolar transistors in a breakdown region can occur in various applications, such as amplifying or switching applications.

Bipolar Transistors in Input Stages

Figure 3:
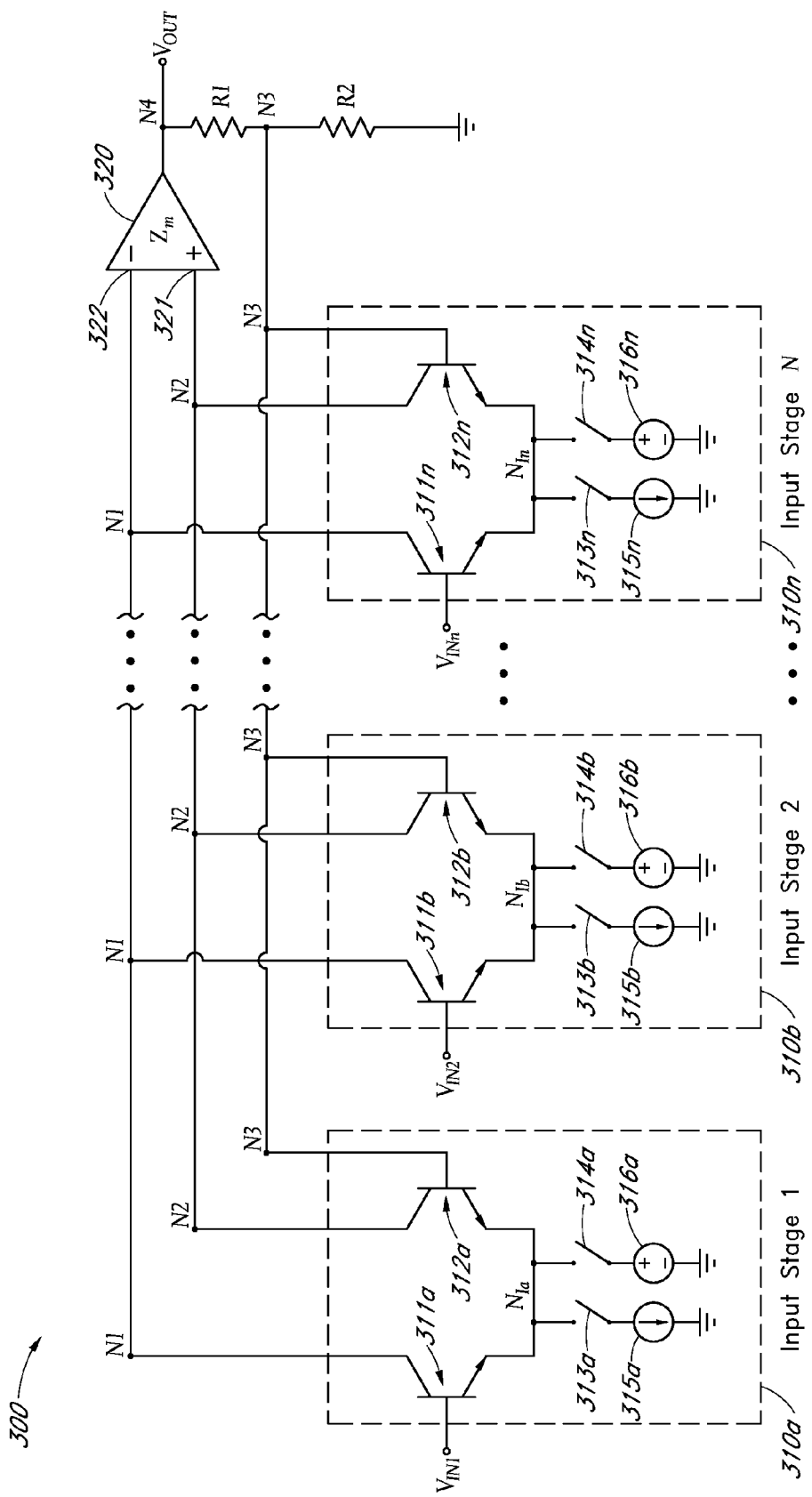
FIG. 3 is a circuit diagram of a conventional multiplexer circuit including multiple input stages.

Referring to FIG. 3, a conventional multiplexer circuit including bipolar transistors for its input stages will be described below. The illustrated multiplexer circuit 300 includes first to n-th input stages 310a-310n, a transimpedance amplifier 320, a first resistor R1, a second resistor R2, first to fourth nodes N1-N4, and first to n-th input nodes $V_{IN1}$-$V_{INn}$. In other embodiments, the first and second resistors R1, R2 can be omitted such that the circuit 300 provides a unity gain with 100% feedback.

The number of the input stages 310a-310n can vary widely depending on the needs. For example, the number of the input stages 310a-310n can be between 2 and 100, for example, 2, 4, 8, 16, 32, or 64.

Each of the first to n-th input stages 310a-310n includes a first bipolar transistor 311a-311n, a second bipolar transistor 312a-312n, a current source 315a-315n, a first switch 313a-313n, a second switch 314a-314n, and an input stage node $N_{Ia}$-$N_{In}$, and is coupled to a voltage source 316a-316n. In another embodiment, the input stages 310a-310n can be coupled to the same voltage source which can be shared among the input stages 310a-310n. In the illustrated example, the first and second transistors 311a-311n, 312a-312n are NPN transistors. However, in other examples, the first and second transistors 311a-311n, 312a-312n can be PNP tran-sistors. In some examples, the switches 313a-313n, 314a-314n, the current sources 315a-315n, and the voltage sources 316a-316n can be implemented by one or more circuits including field effect transistors and/or bipolar transistors.

The first bipolar transistor 311a-311n of each of the input stages 310a-310n includes a collector electrically coupled to the first node N1, a base electrically coupled to a respective one of the input nodes $V_{IN1}$-$V_{INn}$, and an emitter electrically coupled to a respective one of the input stage nodes $N_{Ia}$-$N_{In}$. The second bipolar transistor 312a-312n of each of the input stages 310a-310n includes a collector electrically coupled to the second node N2, a base electrically coupled to the third node N3, and an emitter electrically coupled to the respective one of the input stage nodes $N_{Ia}$-$N_{In}$.

The current source 315a-315n of each of the input stages 310a-310n is electrically coupled to a respective one of the input stage nodes $N_{Ia}$-$N_{In}$ via the first switch 313a-313n, and to ground. Similarly, the voltage source 316a-316n of each of the input stages 310a-310n is electrically coupled to the respective one of the input stage nodes $N_{Ia}$-$N_{In}$ via the second switch 314a-314n, and to ground.

The transimpedance amplifier 320 includes a non-inverting input 321 electrically coupled to the second node N2, an inverting input 322 electrically coupled to the first node N1, and an output electrically coupled to the fourth node N4. The first resistor R1 includes a first end electrically coupled to the fourth node N4, and a second end electrically coupled to the third node N3. The second resistor R2 includes a first end electrically coupled to the third node N3, and a second end electrically coupled to ground or to another voltage reference. In an embodiment in which the first and second resistors R1, R2 are omitted, the fourth node N4 can be directly coupled to the third node N3.

During multiplexing operation, only one of the input stages 310a-310n is enabled while the other input stages are disabled. For example, the first input stage 310a can be enabled while the second to the n-th input stages 310b-310n are disabled.

Each of the input stages 310a-310n can be enabled by switching on the first switch 313a-313n and switching off the second switch 314a-314n, thereby electrically connecting the current source 315a-315n to the input stage node $N_{Ia}$-$N_{In}$ and disconnecting the voltage source 316a-316n from the input stage node $N_{Ia}$-$N_{In}$. In contrast, each of the input stages 310a-310n can be disabled by switching off the first switch 313a-313n and switching on the second switch 314a-314n, thereby electrically disconnecting the current source 315a-315n from the input stage node $N_{Ia}$-$N_{In}$ and connecting the voltage source 316a-316n to the input stage node $N_{Ia}$-$N_{In}$. In the context of this document, "switching on a switch" refers to "closing a switch," and "switching off a switch" refers to "opening a switch."

For example, when the first input stage 310a is enabled and the other input stages 310b-310n are disabled, the first switch 313a of the first input stage 310a is switched on, and the second switch 314a of the first input stage 310a is switched off. At the same time, the first switches 313b-313n of the other input stages 310b-310n are switched off, and the second switches 314b-314n of the other input stages 310b-310n are switched on.

When the first input stage 310a is enabled, the first transistor 311a of the first input stage 310a serves as a transconductance device. The first transistor 311a conducts to provide a current to the first node N1 in response to an input voltage signal at the first input node $V_{IN1}$. The current is provided to the inverting input 322 of the transimpedance amplifier 320, and is converted to a voltage output signal $V_{OUT}$ at the fourth node N4 by the transimpedance amplifier 320. A feedback signal $V_F$ proportional to the voltage output signal $V_{OUT}$ is fed back to the base of the second transistor 312a of the first input stage 310a via a resistor attenuator formed by the first resistor R1 and the second resistor R2. A ratio of the feedback signal $V_F$ to the voltage output signal $V_{OUT}$ can be 1 in the limit of the ratio of the value Ra/Rb approaching zero, where Ra is the resistance of the first resistor R1, and Rb is the resistance of the second resistor R2.

The feedback signal $V_F$ in turn causes the second transistor 312a to conduct, and provides a current to the non-inverting input 321 of the amplifier 320. Thus, the amplifier 320, the first resistor R1, the second resistor R2, and the second transistor 312a form a feedback circuit when the first input stage 310a is enabled.

While the first input stage 310a is enabled, the other input stages 310b-310n are disabled to block other input signals and feedback therethrough. The other input stages 310b-310n can be disabled by disconnecting the current sources 315b-315n from the input stages nodes $N_{Ib}$-$N_{In}$ of the input stages 310b-310n. Further, in order to prevent the first transistors 311b-311n of the disabled input stages 310b-310n from conducting, the voltage sources 316b-316n are coupled to the input stage nodes $N_{Ib}$-$N_{In}$ of the disabled input stages 310b-310n. The voltage sources 316b-316n provide a clamp voltage that is equal to or higher than the maximum input voltage at the input nodes $V_{IN2}$-$V_{INn}$ of the input stages 310b-310n. The clamp voltage is selected to prevent the base-emitter junctions of the transistors 311b-311n, 312b-312n from conducting.

For example, a signal swing at the input nodes $V_{IN2}$-$V_{INn}$ can be between about −10 V and about +10 V. In an instance, the input node $V_{IN2}$ can be at about +10 V when the third node N3 is at about −10 V. In such an instance, the clamp voltage provided by the voltage sources 316b-316n at the input stage node $N_{Ib}$-$N_{In}$ should be at least +10 V to prevent conduction at the base-emitter junctions of the first transistors 311b-311n. In that instance, the base-emitter junctions of the second transistors 312b-312n will be reverse-biased by about 20 V (−20 V).

Bipolar Transistors in Output Stages

Figure 4:
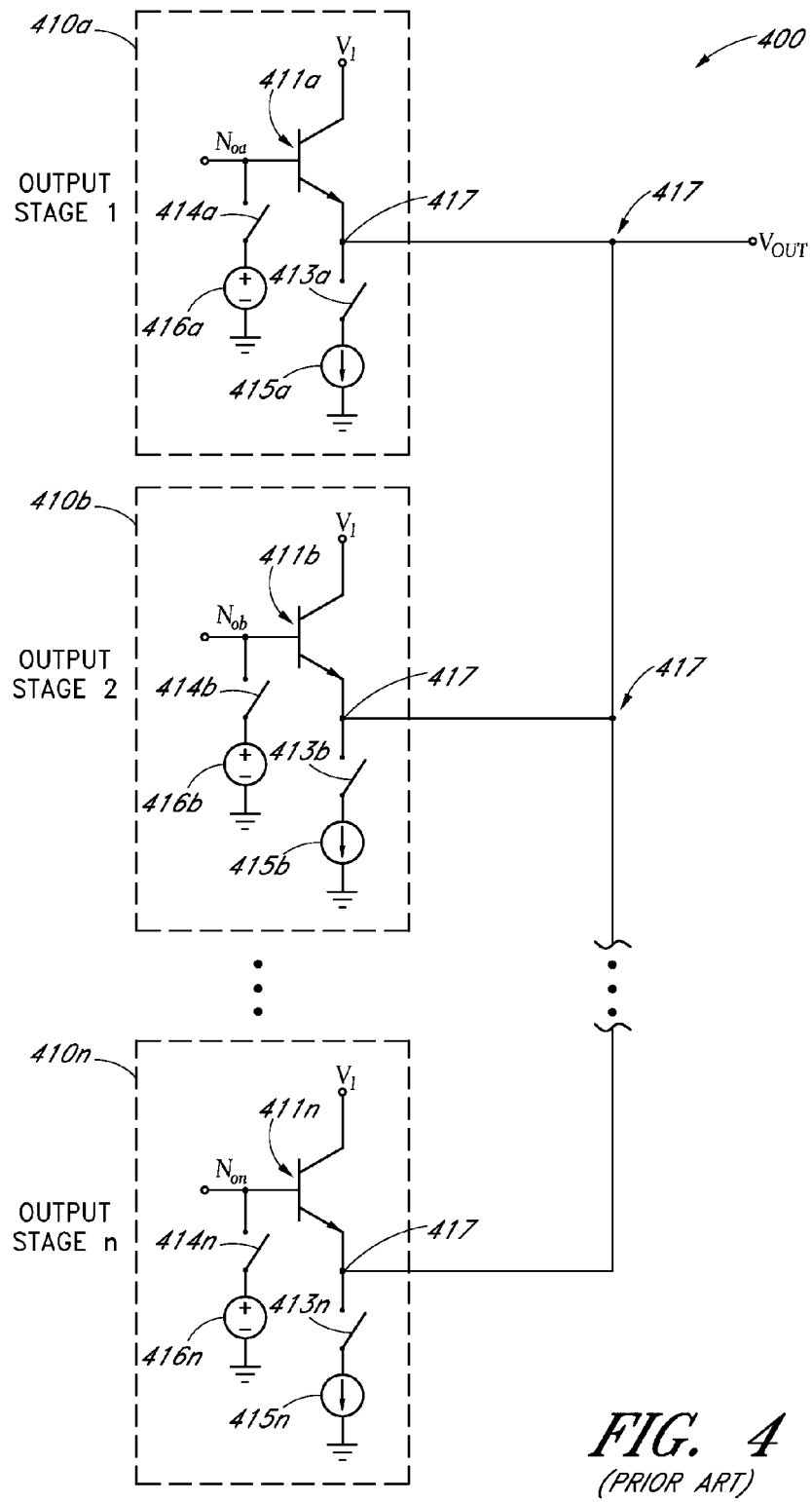
FIG. 4 is a circuit diagram of a conventional bus circuit including multiple output stages.

Referring to FIG. 4, a conventional bussed output circuit including bipolar transistors for its output stages will be described below. The illustrated output circuit 400 includes first to n-th output stages 410a-410n, and a first node 417. The first node 417 serves as an output node for the circuit 400.

The number of the output stages 410a-410n can vary widely depending on the needs. For example, the number of the output stages 410a-410n can be between 2 and 100, for example, 2, 4, 8, 16, 32, or 64.

Each of the first to n-th output stages 410a-410n can include a bipolar transistor 411a-411n, a current source 415a-415n, a first switch 413a-413n, a second switch 414a-414n, and an output stage node $N_{Oa}$-$N_{On}$, and is coupled to a voltage source 416a-416n. In another embodiment, the output stages 410a-410n can be coupled to the same voltage source which can be shared among the output stages 410a-410n. In the illustrated example, the transistors 411a-411n are NPN transistors. However, in other examples, the transistors 411a-411n can be PNP transistors. In some examples, the switches 413a-413n, 414a-414n, the current sources 415a-415n, and the voltage sources 416a-416n can be implemented by one or more circuits including field effect transistors and/or bipolar transistors.

The transistors 411a-411n of each of the output stages 410a-410n includes a collector electrically coupled to a first voltage reference V1, a base electrically coupled to a respective one of the output stage node $N_{Oa}$-$N_{On}$, and an emitter electrically coupled to the first node 417. The current source 415a-415n of each of the output stages 410a-410n is electrically coupled to the first node 417 via the first switch 413a-413n, and to ground. The voltage source 416a-416n of each of the output stages 410a-410n is electrically coupled to the respective one of the output stage node $N_{Oa}$-$N_{On}$ via the second switch 414a-414n, and to ground.

During operation, only one of the output stages 410a-410n is enabled while the output input stages are disabled. For example, the first output stage 410a can be enabled while the second to the n-th output stages 410b-410n are disabled.

Each of the output stages 410a-410n can be enabled by switching on the first switch 413a-413n and switching off the second switch 414a-414n, thereby electrically connecting the current source 415a-415n to the first node 417 and disconnecting the voltage source 416a-416n from the output stage node $N_{Oa}$-$N_{On}$. In contrast, each of the output stages 410a-410n can be disabled by switching off the first switch 413a-413n and switching on the second switch 414a-414n, thereby electrically disconnecting the current source 415a-415n from the first node 417 and connecting the voltage source 416a-416n to the output stage node $N_{Oa}$-$N_{Oa}$.

For example, when the first output stage 410a is enabled and the other output stages 410b-410n are disabled, the first switch 413a of the first output stage 410a is switched on, and the second switch 414a of the first output stage 410a is switched off. At the same time, the first switches 413b-413n of the other output stages 410b-410n are switched off, and the second switches 414b-414n of the other output stages 410b-410n are switched on.

When the first output stage 410a is enabled, the transistor 411a of the first output stage 410a conducts, and provides a voltage to the first node 417 in response to a signal inputted to the base of the transistor 411a. While the first output stage 410a is enabled, the other output stages 410b-410n are disabled to block other output signals from the first node 417. The other output stages 410b-410n can be disabled by disconnecting the current sources 415b-415n from the first node 417.

Further, in order to prevent the transistors 411b-411n of the disabled output stages 410b-410n from conducting, and to prevent feedback from the first node 417 to the output stage nodes $N_{Ob}$-$N_{On}$ of the disabled output stages 410b-410n, the voltage sources 416b-416n are coupled to the output stage nodes $N_{Oa}$-$N_{On}$ of the disabled output stages 410b-410n. The voltage sources 416b-416n provide a clamp voltage that is equal to or lower than the minimum voltage at the first node 417. The clamp voltage is selected to pull the output stage nodes $N_{Ob}$-$N_{On}$ to a low voltage to prevent the base-emitter junctions of the transistors 411b-411n from forward biasing. This is so that the first output stage 410a can drive the first node 417 to a low voltage without biasing the base-emitter junctions of the other output stages 410b-410n into its conduction range.

For example, if the first node 417 is expected to be driven from about 0V to about +5V, the output stage nodes $N_{Ob}$-$N_{On}$ of the disabled output stages 410b-410n should be pulled to about 0 V to avoid conduction in the transistors 411b-411n when the voltage on the first node 417 is pulled to about 0 V by the first output stage 410a. With such a bias, when the first node 417 is pulled to, for example, +5 V by the first output stage 410a, a reverse bias voltage of about 5 V (−5 V) is applied across the base-emitter junctions of the transistors 411b-411n of the disabled output stages 410b-410n.

Circuits for Semiconductor Junction Protection

In the examples described above in connection with FIGS. 3 and 4, the base-emitter junctions of the transistors in the disabled input or output stages can be reverse-biased while the full swing signal is applied to the bases (in the case of FIG. 3) or emitters (in the case of FIG. 4) of the transistors. A problem arises that, in a modern process technology, the tolerable base-emitter reverse bias can be much lower than such full signal swings. For many high-speed processes, more than 2 V reverse bias can cause permanent device damage to modern bipolar transistors (for example, those made by a sub-micron process).

Such reverse bias of 2V for short time periods noticeably degrades key parameters of a bipolar transistor, for example, a current gain. Thus, the reverse bias of 20 V (−20 V) in the example of FIG. 3 and that of 5 V (−5V) in the example of FIG. 4 can be detrimental to the circuits of FIGS. 3 and 4, respectively. Thus, there is a need for providing a circuit for protecting the semiconductor junction of a bipolar transistor from reverse bias damage. Further, there is a need for providing a circuit with low-power and low number of devices without greatly load or reduce headroom in the circuit being protected.

In some embodiments, a bipolar transistor is provided with a protection circuit that can protect the bipolar transistor from reverse bias damage. In one embodiment, the protection circuit includes a first protection device having an anode electrically coupled to the emitter of the bipolar transistor, and a cathode electrically configured to receive a voltage that can reverse bias the base-emitter junction of the bipolar transistor. The protection circuit further includes a second protection device having a cathode electrically coupled to the emitter of the bipolar transistor, and an anode electrically coupled to a voltage reference. The first and second protection devices have a substantially higher leakage current than that of the base-emitter junction of the bipolar transistor during reverse bias operation. The leakage currents of the first and second protection devices can be, for example, 2 to 10,000 times higher (for example, 2×, 3×, 5×, 10×, 20×, 50×, or 100× higher) than that of the base-emitter junction of the bipolar transistor at the same reverse bias voltage. The protection devices also have reverse breakdown voltages greater (more negative) than the maximum allowable reverse-bias voltage of the base-emitter junction of the bipolar transistor.

During reverse bias operation, the first and second protection devices form a voltage divider with one end coupled to the reverse bias voltage, and the other end coupled to the voltage reference. Further, the protection devices have substantially the same leakage current as each other, thus the reverse bias voltage is substantially evenly divided across the two protection devices. Thus, a voltage provided to the emitter of the bipolar transistor (at a node between the two protection devices) can be chosen such that the base-emitter junction of the bipolar transistor can withstand the reverse bias voltage. In one embodiment, each of the protection devices can be formed by a Schottky diode. In another embodiment, each of the protection devices can be formed by a diode-connected bipolar transistor with its emitter and base shorted to each other.

Figure 5B:
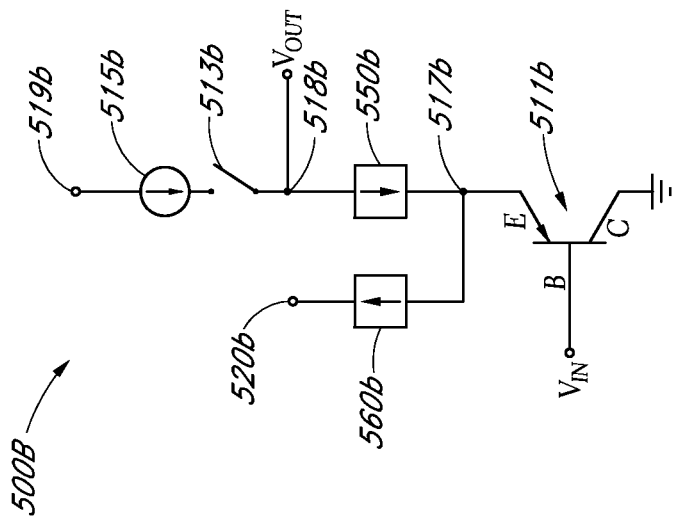
FIG. 5B is a schematic block diagram of a circuit including a PNP bipolar transistor and a junction protection circuit according to another embodiment.
Figure 5A:
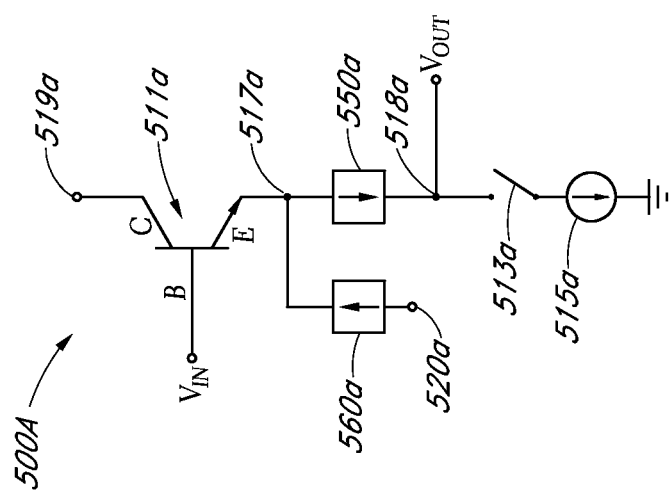
FIG. 5A is a schematic block diagram of a circuit including an NPN bipolar transistor and a junction protection circuit according to one embodiment.

Referring to FIG. 5A, one embodiment of a junction protection circuit will be described below. The illustrated circuit 500A includes an NPN bipolar transistor 511a, a first protection device 550a, a second protection device 560a, a current source 515a, a first switch 513a, a first node 517a, and a second node 518a.

The transistor 511a can serve as a switching device that is to be protected by the protection devices 550a, 560a from reverse bias. The transistor 511a includes a collector electrically coupled to a first voltage reference 519a, a base configured to receive an input voltage $V_{IN}$, and an emitter electrically coupled to the first node 517a.

The first protection device 550a and the second protection device 560a together form the junction protection circuit for protecting the semiconductor junction (particularly, base-emitter junction) of the transistor 511a. The first and second protection devices 550a, 560a can have substantially the same leakage current when reverse-biased. Examples of the first protection device 550a include, but are not limited to: a Schottky diode, a diode-connected transistor, and a pn junction diode. Examples of the second protection device 560a include, but are not limited to: a Schottky diode, a diode-connected transistor, a pn junction diode, and a resistor. In some embodiments, the first protection device 550a can have the same kind of device as the second protection device 560a. In other embodiments, the first protection device 550a can have a different type of device than the second protection device 560a. Each of the first and second protection devices 550a, 560a can have one or more of the foregoing devices, depending on the application.

The first protection device 550a includes an anode coupled to the first node 517a, and a cathode coupled to the second node 518a. The second protection device 560a includes an anode coupled to a second voltage reference 520a, and a cathode coupled to the first node 517a. Thus, the first protection device 550a and the second protection device 560a are forward-biased when a voltage applied to the anode is higher than a voltage applied to the cathode. In contrast, the first protection device 550a and the second protection device 560a are reverse-biased when a voltage applied to the anode is lower than a voltage applied to the cathode. Arrows on the first and second protection devices 550a, 560a indicate the direction for forward bias.

The second voltage reference 520a is configured to provide a voltage to the anode of the second protection device 560a such that the second protection device 560a remains reverse biased and inactive while a signal path formed by the bipolar transistor 511a and the first protection device 550a is forward biased. Further, the voltage provided by the second voltage reference 520a is chosen to provide a safe reverse bias voltage at the first node 517a such that the base-emitter junction of the bipolar transistor 511a is not damaged or degraded. In one embodiment, the voltage provided by the second voltage reference 520a can be a negative voltage of, for example, between about −5.5 V and about −4.5 V. In certain embodiments, the second voltage reference 520a can provide a variable voltage, depending on the application.

Each of the first protection device 550a and the second protection device 560a can have a substantially higher leakage current than that of the base-emitter junction of the transistor 511a when reverse-biased. Further, each of the first and second protection devices 550a, 560a has a reverse breakdown voltage greater (in magnitude) than the maximum allowed reverse bias voltage of the base-emitter junction of the transistor 511a. In some embodiments, each of the first and second protection devices 550a, 560a is formed by a single device, rather than multiple devices connected in series.

The current source 515a is electrically coupled to the second node 518a via the first switch 513a, and to ground. In one embodiment, the second node 518a can serve as an output node during operation. In another embodiment, a node coupled to the collector of the transistor 511a can serve as an output node during operation.

When the transistor 511a needs to be enabled, the first switch 513a is switched on. An input voltage $V_{IN}$ is provided to the base of the transistor 511a, and the emitter of the transistor 511a outputs a voltage signal to the first node 517a. When enabled, the first protection device 550a is forward-biased, and appears as degeneration to the transistor 511a. When enabled, the second protection device 560a is reverse-biased, and appears as a parasitic capacitance.

When the transistor 511a is disabled, the first switch 513a is switched off. When a voltage is applied to the second node 518a, the first protection device 550a can be reverse-biased. In one embodiment, the leakage currents of the first and second protection devices 550a, 560a can be about an order of magnitude greater than the leakage current of the emitter-base junction of the transistor 511a.

Because the leakage current of the base-emitter junction of the transistor 511a is substantially smaller than the leakage currents of the protection devices 550a, 560a, the amount of voltage appearing at the first node 517a is set by the reverse voltage across the protection devices 550a, 560a. By coupling the anode of the second protection device 560a to a selected voltage, the voltage at the first node 517a (which is applied to the emitter of the transistor 511a) can be set. This allows the voltage at the emitter to be set at a voltage level that does not damage the base-emitter junction of the transistor 511a.

Further, because the leakage currents of the first and second protection devices 550a, 560a are substantially the same as each other, the second protection device 560a consumes the leakage current of the first protection device 550a, thereby forming a leakage current path. The first and second protection devices 550a, 560a divide the reverse voltage difference between the voltage at the second node 518a and the second voltage reference 520a equally at the intermediate node (the first node 517a). Thus, the bipolar transistor 511a can be minimally affected by the leakage current from the first protection device 550a.

Referring to FIG. 5B, another embodiment of a junction protection circuit will be described below. The illustrated circuit 500B includes a PNP bipolar transistor 511b, a first protection device 550b, a second protection device 560b, a first switch 513b, a current source 515b, a first node 517b, and a second node 518b.

The transistor 511b serves as a switching device that is to be protected by the protection devices 550b, 560b from reverse bias. The transistor 511b includes a collector electrically coupled to ground, a base electrically configured to receive an input voltage $V_{IN}$, and an emitter electrically coupled to the first node 517b.

The first protection device 550b and the second protection device 560b together form the junction protection circuit for protecting the semiconductor junction (or base-emitter junction) of the transistor 511b. The first protection device 550b includes an anode coupled to the second node 518b, and a cathode coupled to the first node 517b. The second protection device 560b includes an anode coupled to the first node 517b, and a cathode coupled to a second voltage reference 520b. In one embodiment, a voltage provided by the second voltage reference 520b can be a positive voltage of, for example, between about +4.5 V and about +5.5 V. In certain embodiments, the second voltage reference 520b can provide a variable voltage, depending on the application.

Each of the first protection device 550b and the second protection device 560b is forward-biased when a voltage applied to the anode is higher than a voltage applied to the cathode. In contrast, each of the first protection device 550b and the second protection device 560b is reverse-biased when a voltage applied to the anode is lower than a voltage applied to the cathode. Other details of the first protection device 550b and the second protection device 560b can be as described above in connection with FIG. 5A.

The current source 515b is electrically coupled to the second node 518b via the first switch 513b, and to a first voltage reference 519b. In one embodiment, the second node 518b can serve as an output node during operation.

When the transistor 511b is enabled, the first switch 513b is switched on. An input voltage $V_{IN}$ is provided to the base of the transistor 511b, and the emitter of the transistor 511b outputs a voltage signal to the first node 517b. When enabled, the first protection device 550b is forward-biased, and appears as degeneration to the transistor 511b. When enabled, the second protection device 560b is reverse-biased, and appears as a parasitic capacitance.

When the transistor 511b is disabled, the first switch 513b is switched off. When a voltage lower than the input voltage $V_{IN}$ is applied to the second node 518b, the base-emitter junction of the transistor 511b and the first protection device 550b can be reverse-biased. In one embodiment, the leakage currents of the first and second protection devices 550b, 560b can be an order of magnitude greater than the leakage current of the emitter-base junction of the transistor 511b.

Because the leakage current of the transistor 511b is substantially smaller than those of the protection devices 550b, 560b, the amount of voltage appearing at the first node 517b is set by the reverse voltage across the protection devices 550b, 560b. By coupling the cathode of the second protection device 560b to a selected voltage, the voltage at the first node 517b, which is applied to the emitter of the transistor 511b, can be set. This allows the voltage at the emitter to be set at a voltage level that does not damage the base-emitter junction of the transistor 511b.

Figure 6B:
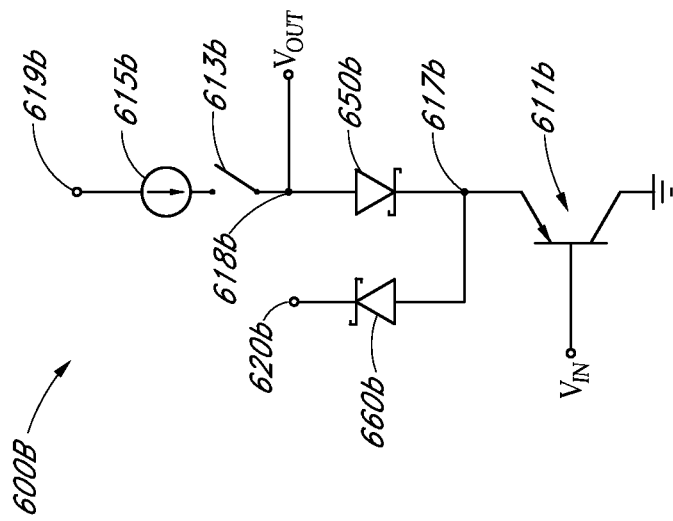
FIG. 6B is a circuit diagram of a circuit including a PNP bipolar transistor and Schottky diodes for junction protection of the transistor according to another embodiment.
Figure 6A:
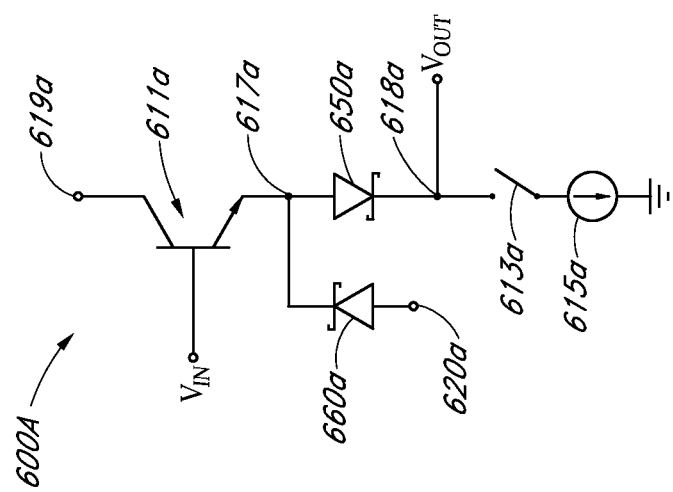
FIG. 6A is a circuit diagram of a circuit including an NPN bipolar transistor and Schottky diodes for junction protection of the transistor according to one embodiment.

Referring to FIG. 6A, another embodiment of a junction protection circuit will be described below. The illustrated circuit 600A includes an NPN bipolar transistor 611a, a first Schottky diode 650a, a second Schottky diode 660a, a first switch 613a, a current source 615a, a first node 617a, and a second node 618a. Details of the NPN transistor 611a, the current source 615a, the first node 617a, and the second node 618a can be as described above in connection with those of the circuit 500A of FIG. 5A.

The first Schottky diode 650a and the second Schottky diode 660a together form the junction protection circuit for protecting the semiconductor junction (for example, base-emitter junction) of the transistor 611a. The first Schottky diode 650a includes an anode coupled to the first node 617a, and a cathode coupled to the second node 618a. The second Schottky diode 660a includes an anode coupled to a second voltage reference 620a, and a cathode coupled to the first node 617a. Thus, each of the first Schottky diode 650a and the second Schottky diode 660a is forward-biased when a voltage applied to the anode is higher than a voltage applied to the cathode. In contrast, each of the first Schottky diode 650a and the second Schottky diode 660a is reverse-biased when a voltage applied to the anode is lower than a voltage applied to the cathode.

Each of the first Schottky diode 650a and the second Schottky diode 660a can withstand greater reverse bias voltage than bipolar transistors without permanent or temporary degradation of its electrical characteristics. Each of the first Schottky diode 650a and the second Schottky diode 660a can have a substantially higher leakage current than that of the base-emitter junction of the transistor 611a when reverse-biased.

The relation between the reverse bias voltage and the base-emitter leakage current of a bipolar transistor is shown in FIG.

Figure 7A:
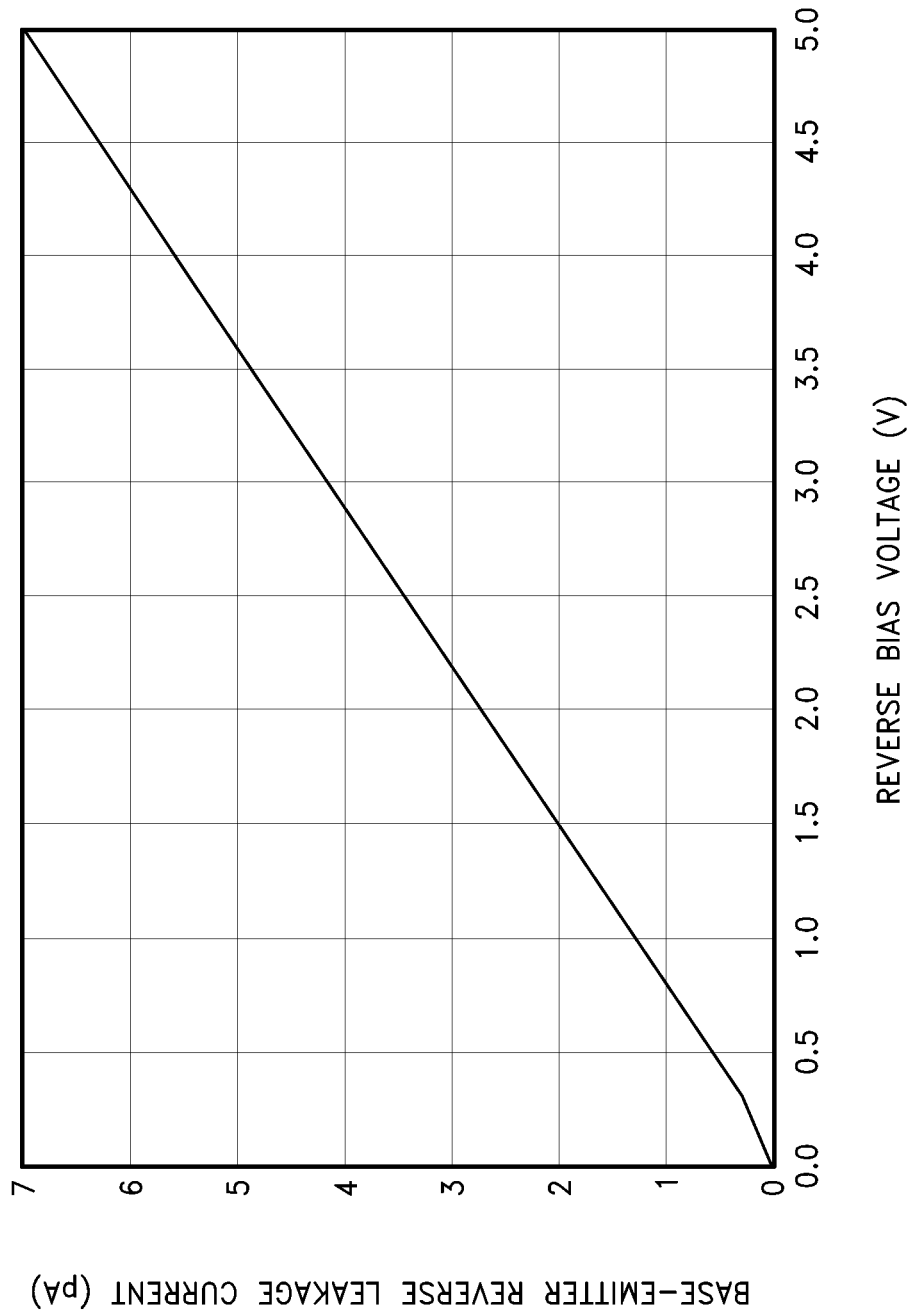
FIG. 7A is a graph illustrating a relationship between the reverse bias voltage and the leakage current of a bipolar transistor.
Figure 7B:
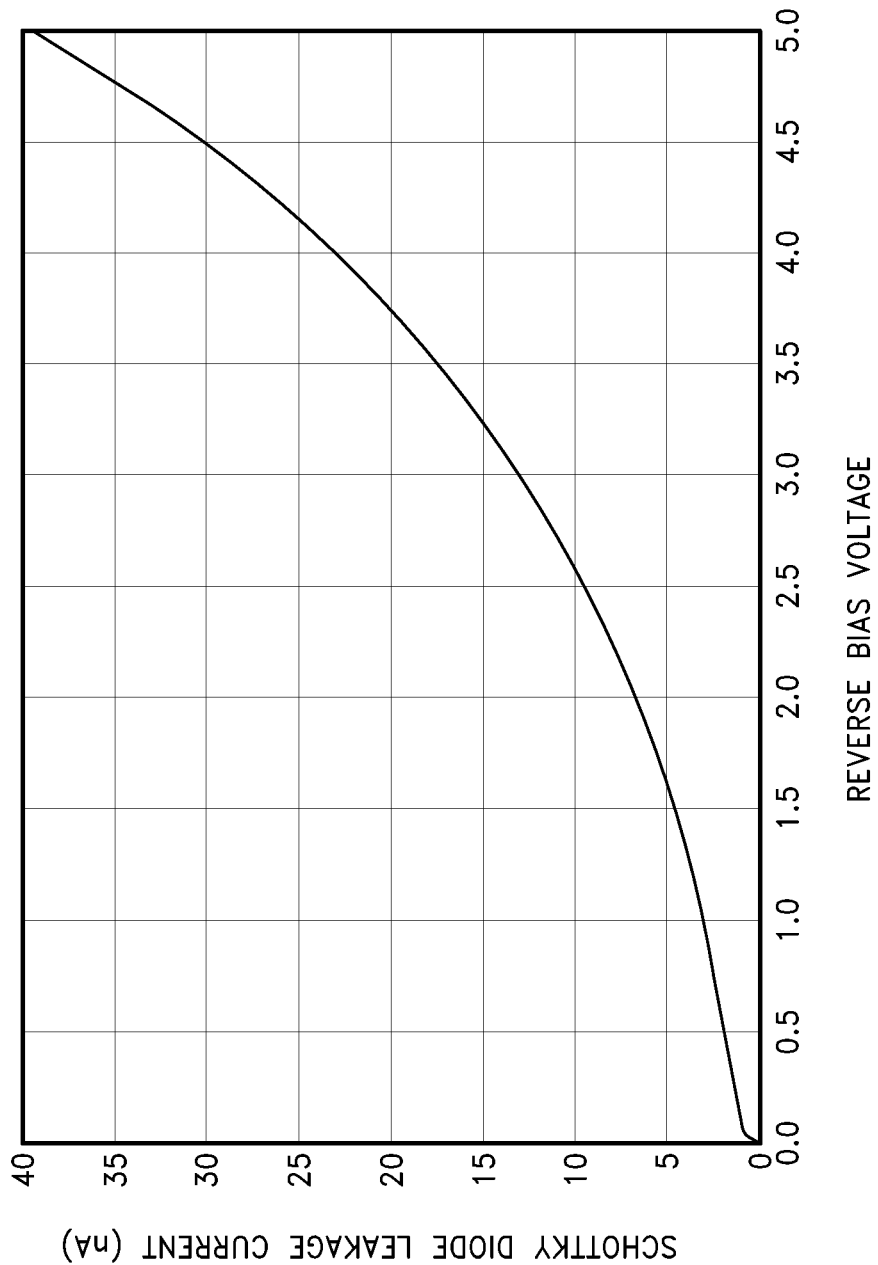
FIG. 7B is a graph illustrating a relationship between the reverse bias voltage and the leakage current of a Schottky diode.

7A. In addition, the relation between the reverse bias voltage and the leakage current of a Schottky diode is shown in FIG. 7B. As shown in FIGS. 7A and 7B, a Schottky diode has a substantially greater leakage current than a bipolar transistor at the same reverse voltage. This allows the Schottky diodes 650a, 660a to dominate the setting of the emitter voltage of the transistor 611a. Further, each of the first and second Schottky diodes 650a, 660a can have a greater reverse (magnitude) breakdown voltage (for example, a breakdown voltage of lower than about −20 V) than that of the base-emitter junction of the transistor 611a (for example, a breakdown voltage of about −2 V).

When the transistor 611a is enabled, the first switch 613a is switched on. An input voltage $V_{IN}$ is provided to the base of the transistor 611a, and the emitter of the transistor 611a outputs a voltage signal to the first node 617a. During this operation, the first Schottky diode 650a is forward-biased, and appears as degeneration to the transistor 611a. When enabled, the second Schottky diode 660a is reverse-biased, and appears as a parasitic capacitance.

When the transistor 611a is disabled, the first switch 613a is switched off. When a voltage greater than the input voltage $V_{IN}$ is applied to the second node 618a, the first Schottky diode 650a can be reverse-biased. In one embodiment, the leakage currents of the first and second Schottky diodes 650a, 660a are at least an order of magnitude greater than the leakage current of the emitter-base junction of the transistor 611a. The relative leakage currents of the Schottky diodes 650a, 660a can be determined by sizing of the Schottky diodes 650a, 660a.

Because the leakage current of the transistor 611a is substantially smaller than those of the Schottky diodes 650a, 660a, the amount of voltage appearing at the first node 617a is set by the reverse voltage across the Schottky diodes 650a, 660a. By coupling the anode of the second Schottky diode 660a to a selected voltage, the voltage at the first node 617a, which is applied to the emitter of the transistor 611a, can be set. This allows the voltage at the emitter to be set at a voltage level that does not damage the base-emitter junction of the transistor 611a.

For example, when the circuit 600A needs to be disabled, the second node 618a can be applied with, for example, about +2.7 V, either by another enabled bussed output, or by a circuit that purposely clamps the transistor 611a in a cut-off state. In such an instance, the second voltage reference 620a can be at, for example, about −5 V. The voltage divider formed by the Schottky diodes 650a, 660a splits the clamping voltage such that the voltage at the first node 617a is, for example, about −1.15 V.

In such an instance, a signal swing at the input node $V_{IN}$ can be, for example, about ±3 V. When the swing is about +3 V, the transistor 611a is forward-biased enough to begin to conduct, but there is not enough potential to forward bias the first Schottky diode 650a into significant conduction, and as such the circuit 600A remains disabled. When the swing is about −3 V, the transistor 611a is reverse-biased as desired, but with a safe reverse base-emitter voltage of about 1.85 V. If the second Schottky diode 660a were not in the circuit 600A, the voltage at the first node 617a would be approximately +2.7 V, and the reverse bias on the emitter-base junction of the transistor 611a would be greater, for example, +5.7 V, which would damage the junction.

Referring to FIG. 6B, yet another embodiment of a junction protection circuit will be described below. The illustrated circuit 600B includes a PNP bipolar transistor 611b, a first Schottky diode 650b, a second Schottky diode 660b, a first switch 613b, a current source 615b, a first node 617b, and a second node 618b. Details of the PNP transistor 611b, the current source 615b, the first node 617b, and the second node 618b can be as described above in connection with those of the circuit 500B of FIG. 5B.

The first Schottky diode 650b and the second Schottky diode 660b together form the junction protection circuit for protecting the semiconductor junction (or base-emitter junction) of the transistor 611b. The first Schottky diode 650b includes an anode coupled to the second node 618b, and a cathode coupled to the first node 617b. The second Schottky diode 660b includes an anode coupled to the first node 617b, and a cathode coupled to a second voltage reference 620b. Other details of the first Schottky diode 650b and the second Schottky diode 660b can be as described above in connection with FIG. 6A.

When the transistor 611b is enabled, the first switch 613b is switched on. An input voltage $V_{IN}$ is provided to the base of the transistor 611a, and the emitter of the transistor 611b outputs a voltage signal to the first node 617b. When enabled, the first Schottky diode 650b is forward-biased, and appears as degeneration to the transistor 611a. When the transistor 611b is enabled, the second Schottky diode 660b is reverse-biased, and appears as a parasitic capacitance.

When the transistor 611b is disabled, the first switch 613b is switched off. When a voltage lower than the input voltage $V_{IN}$ is applied to the second node 618b, the base-emitter junction of the transistor 611b and the first Schottky diode 650b can be reverse-biased. In one embodiment, the leakage currents of the first and second Schottky diodes 650b, 660b can be an order of magnitude greater than the leakage current of the emitter-base junction of the transistor 611b.

Because the leakage current of the transistor 611b is substantially smaller than those of the Schottky diodes 650b, 660b, the amount of voltage appearing at the first node 617b is set by the reverse voltage across the Schottky diodes 650b, 660b. By coupling the anode of the second Schottky diode 660b to a selected voltage, the voltage at the first node 617b, which is applied to the emitter of the transistor 611b, can be set. This allows the voltage at the emitter to be set at a voltage level that does not damage the base-emitter junction of the transistor 611b.

For example, the second node 618b can be applied with a voltage swing of 0 V to +5 V by an external circuit. When the circuit 600B is disabled, the input node $V_{IN}$ can be pulled to a clamping voltage of +4 V to keep the transistor 611b from conducting. When the second node 618b is pulled to 0 V by the external circuit, a reverse bias voltage is applied to the base-emitter junction of the transistor 611b. Without the Schottky diode 650b, the reverse bias voltage on the base-emitter junction would be 4 V, or twice the tolerable voltage.

When the cathode of the second Schottky diode 660b is coupled to a positive voltage (620b) of +4.5 V, the first node 617b can be at +2.25 V by the operation of the voltage divider formed by the Schottky diodes 650b, 660b. With the input node $V_{IN}$ still clamped at +4 V, the reverse-bias on the base-emitter junction of the transistor 611b is only 1.75 V, which is tolerable. The Schottky diodes 650b, 660b do not conduct significantly when the second node 618b is brought to +5 V because the cathode of the second Schottky diode 660b is set to +4.5 V.

Referring to FIG. 8A, another embodiment of a junction protection circuit will be described below. The illustrated circuit 800A includes an NPN bipolar transistor 811a, a first diode-connected transistor 850a, a second diode-connected transistor 860a, a current source 815a, a first node 817a, and a second node 818a. Details of the NPN transistor 811a, the current source 815*a*, the first node 817*a*, and the second node 818*a* can be as described above in connection with those of the circuit 500A of FIG. 5A.

The first diode-connected transistor 850*a* and the second diode-connected transistor 860*a* together form the junction protection circuit for protecting the semiconductor junction (the base-emitter junction) of the transistor 811*a*. In the illustrated embodiment, each of the first and second diode-connected transistors 850*a*, 860*a* is an NPN transistor. In other embodiments, each of the first and second diode-connected transistor 850*a*, 860*a* can be either an NPN transistor or PNP transistor.

The first diode-connected transistor 850*a* includes an emitter electrically coupled to the first node 817*a*, a base electrically coupled to the emitter, and a collector electrically coupled to the second node 818*a*. The first diode-connected transistor 850*a* functions as the first protection device 550*a* (FIG. 5A) having an anode coupled to the first node 817*a*, and a cathode coupled to the second node 818*a*. In another embodiment in which the first diode-connected transistor is a PNP transistor, the PNP transistor can have a collector electrically coupled to the first node 817*a*, a base electrically coupled to the collector, and an emitter electrically coupled to the second node 818*a*.

The second diode-connected transistor 860*a* includes an emitter electrically coupled to a second voltage reference 820*a*, a base electrically coupled to the emitter, and a collector electrically coupled to the first node 817*a*. The second diode-connected transistor 860*a* functions as the second protection device 560*a* (FIG. 5A) having an anode coupled to the second voltage reference 820*a*, and a cathode coupled to the first node 817*a*. In an alternative embodiment in which the second diode-connected transistor is a PNP transistor, the PNP transistor can have a collector electrically coupled to a second voltage reference 820*a*, a base electrically coupled to the collector, and an emitter electrically coupled to the first node 817*a*.

Thus, each of the first diode-connected transistor 850*a* and the second diode-connected transistor 860*a* is forward-biased when a voltage applied to the emitter is higher than a voltage applied to the collector. In contrast, each of the first diode-connected transistor 850*a* and the second diode-connected transistor 860*a* is reverse-biased when a voltage applied to the emitter is lower than a voltage applied to the collector.

Each of the first diode-connected transistor 850*a* and the second diode-connected transistor 860*a* can have a much higher leakage current than that of the base-emitter junction of the transistor 811*a* when reverse-biased. The diode-connected transistors 850*a* and 860*a* are connected such that their larger, base-collector junctions are being used in order to raise the reverse leakage current above that of the base-emitter junction of the bipolar transistor 811*a*. Further, each of the first and second diode-connected transistors 850*a*, 860*a* can have a greater reverse (magnitude) breakdown voltage than that of the base-emitter junction of the transistor 811*a*. The operation of the diode-connected transistors 850*a*, 860*a* can be as described above with respect to the protection devices 550*a*, 560*a* of FIG. 5A.

Referring to FIG. 8B, yet another embodiment of a junction protection circuit will be described below. The illustrated circuit 800B includes a PNP bipolar transistor 811*b*, a first diode-connected transistor 850*b*, a second diode-connected transistor 860*b*, a current source 815*b*, a first node 817*b*, and a second node 818*b*. Details of the PNP transistor 811*b*, the current source 815*b*, the first node 817*b*, and the second node 818*b* can be as described above in connection with those of the circuit 500B of FIG. 5B.

The first diode-connected transistor 850*b* and the second diode-connected transistor 860*b* together form the junction protection circuit for protecting the semiconductor junction (the base-emitter junction) of the transistor 811*b*.

The first diode-connected transistor 850*b* includes an emitter electrically coupled to the second node 818*b*, a base electrically coupled to the emitter, and a collector electrically coupled to the first node 817*b*. The first diode-connected transistor 850*b* functions as the first protection device 550*b* of FIG. 5B having an anode coupled to the second node 818*b*, and a cathode coupled to the first node 817*b*. In another embodiment in which the first diode-connected transistor is a PNP transistor, the PNP transistor can have a collector electrically coupled to the second node 818*b*, a base electrically coupled to the collector, and an emitter electrically coupled to the first node 817*b*.

The second diode-connected transistor 860*b* includes an emitter electrically coupled to the first node 817*b*, a base electrically coupled to the emitter, and a collector electrically coupled to the second voltage reference 820*b*. The second diode-connected transistor 850*b* functions as the second protection device 560*b* (FIG. 5B) having an anode coupled to the first node 817*b*, and a cathode coupled to the second voltage reference 820*b*. Other details of the first diode-connected transistor 850*b* and the second diode-connected transistor 860*b* can be as described above in connection with FIG. 8A. In another embodiment in which the second diode-connected transistor is a PNP transistor, the PNP transistor can have a collector electrically coupled to the first node 817*b*, a base electrically coupled to the collector, and an emitter electrically coupled to the second voltage reference 820*b*. The operation of the diode-connected transistors 850*b*, 860*b* can be as described above with respect to the protection devices 550*b*, 560*b* of FIG. 5B.

Input Stage with Semiconductor Junction Protection

Figure 9:
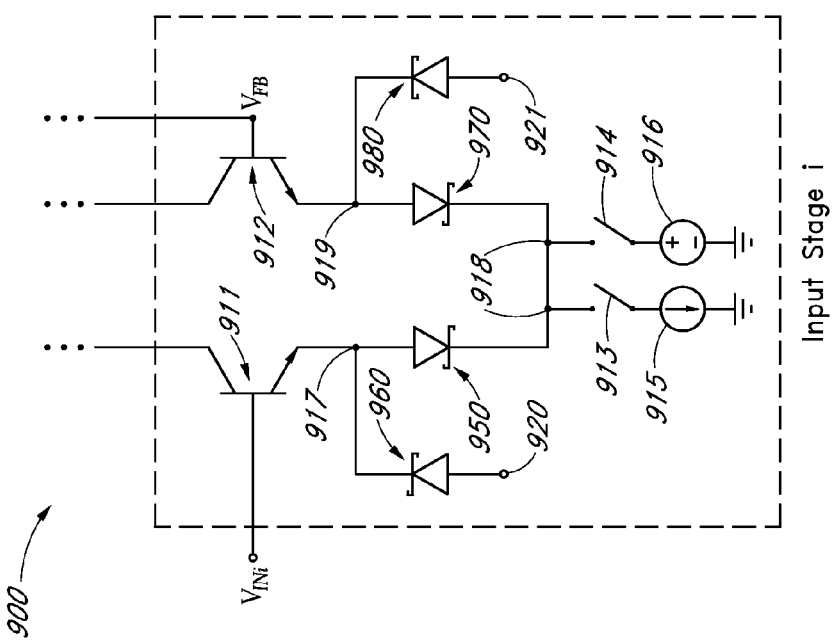
FIG. 9 is a circuit diagram illustrating an input stage of a multiplexer circuit, including a junction protection circuit according to one embodiment.

Referring to FIG. 9, a multiplexer circuit including semiconductor junction protection for bipolar transistors will be described below. The multiplexer circuit can be the same as the circuit 300 of FIG. 3 except that each of the input stages 310*a*-310*n* is replaced with an input stage 900 shown in FIG. 9, which shows only one input stage for simplicity. Thus, the multiplexer circuit can includes first to n-th input stages, a transimpedance amplifier, a first resistor, a second resistor, first to fourth nodes, and first to n-th input nodes, the details of which can be as described above in connection with FIG. 3. In certain embodiments, the first and second resistors can be omitted, or other feedback elements can be added to the multiplexer circuit.

The illustrated input stage 900 includes a first bipolar transistor 911, a second bipolar transistor 912, a current source 915, a first switch 913, a second switch 914, a first node 917, a second node 918, and a third node 919, and is coupled to a voltage source 916. In the illustrated embodiment, the first and second transistors 911, 912 are NPN transistors. However, a skilled artisan will appreciate that the input stage can be modified such that the first and second transistors 911, 912 can be PNP transistors.

Details of the first bipolar transistor 911 can be the same as those of the first transistor 311*a*-311*n* of FIG. 3 except that the emitter of the first transistor 911 is coupled to the first node 917. Similarly, details of the second bipolar transistor 912 can be the same as those of the second transistor 312*a*-312*n* of FIG. 3 except that the emitter of the second transistor 911 is coupled to the third node 919. Details of the first and second switches 913, 914 can be the same as those of the first and second switches 313*a*-313*n*, 314*a*-314*n* of FIG. 3 except that one end of each of the first and second switches 913, 914 is coupled to the second node 918.

The input stage 900 can further include a first Schottky diode 950, a second Schottky diode 960, a third Schottky diode 970, and a fourth Schottky diode 980. The first and second Schottky diodes 950, 960 together serve to protect the base-emitter junction of the first transistor 911 from reverse bias damage. The anode of the second Schottky diode 960 can be coupled to a second voltage reference 920. Other details of the first and second Schottky diodes 950, 960 and the second voltage reference 920 can be as described above in connection with the first and second Schottky diodes 650a, 660a and the second voltage reference 620a, respectively, of FIG. 6A.

The third and fourth Schottky diodes 970, 980 together serve to protect the base-emitter junction of the second transistor 912 from reverse bias damage. The anode of the fourth Schottky diode 980 can be coupled to a third voltage reference 921, which can be the same as or different from the second voltage reference 920. Other details of the third and fourth Schottky diodes 970, 980 and the third voltage reference 921 can be as described above in connection with the first and second Schottky diodes 650a, 660a and the second voltage reference 920, respectively, of FIG. 6A.

As described above in connection with FIG. 3, during multiplexing operation, only one of the input stages is enabled while the other input stages are disabled. Detailed operation of the multiplexing circuit can be as described above in connection with FIG. 3.

In the disabled input stages, the first switch 913 is switched off, and the second switch 914 is switched on to clamp the first transistor 911. The second switch 914, by being closed to couple the voltage source 916 to the second node 918, reverse-biases the base-emitter junctions of the bipolar transistors 911, 912 to prevent crosstalk between the input voltage $V_{IN}$ and a feedback node $V_{FB}$.

Without the first and second Schottky diodes 950, 960, the reverse bias across the base-emitter junction of the first transistor 911 would be detrimental to the transistor 911, as described above in connection with FIG. 3. However, the first and second Schottky diodes 950, 960 protect the first transistor 911 from reverse bias damage by providing a tolerable reverse bias voltage to the emitter of the first transistor 911.

Further, the second transistor 912 can receive a feedback signal at the base thereof via the feedback node $V_{FB}$ while the emitter of the second transistor 912 is clamped by the voltage source $V_S$. The feedback signal may swing lower than the voltage level of the voltage source. In such an instance, without the third and fourth Schottky diodes 970, 980, the reverse bias across the base-emitter junction of the second transistor 912 would be detrimental to the transistor 912. However, the third and fourth Schottky diodes 970, 980 protect the second transistor 912 from reverse bias damage by providing a tolerable reverse bias voltage to the emitter of the second transistor 912. The detailed operation of the Schottky diodes 950-980 can be as described above in connection with FIG. 6A.

In another embodiment, the input stage 900 may include PNP transistors in place of the NPN transistors of FIG. 9. In such an embodiment, the circuit of the input stage 900 may be modified with the circuit 600B shown in FIG. 6B. In other embodiments, the input stage 900 may include diode-connected transistors in place of the Schottky diodes of FIG. 9. In such embodiments, the circuit of the input stage 900 can be modified with either of the circuits 800A, 800B of FIGS. 8A and 8B.

Output Stage with Semiconductor Junction Protection

Figure 10:
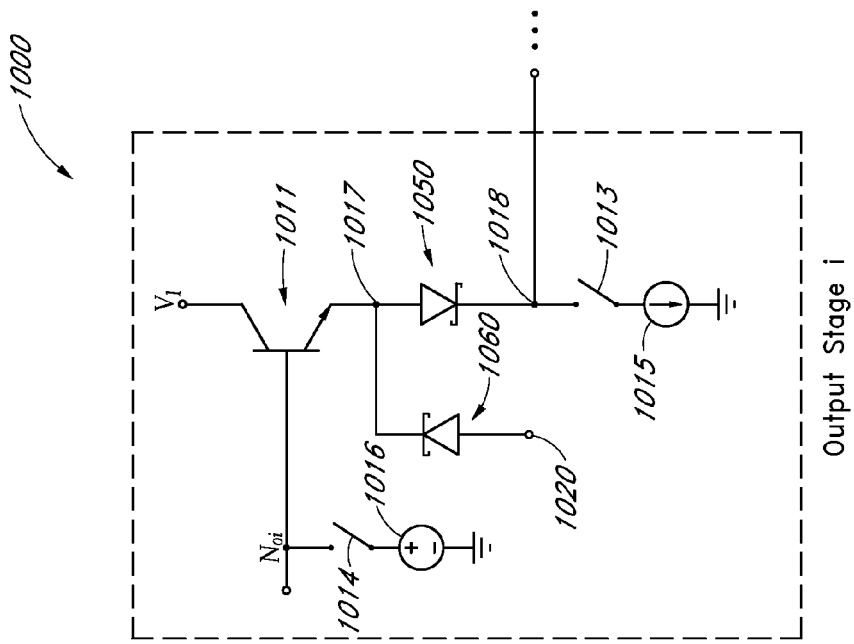
FIG. 10 is a circuit diagram illustrating an output stage of a bus circuit, including a junction protection circuit according to another embodiment.

Referring to FIG. 10, a bussed output circuit including semiconductor junction protection for bipolar transistors will be described below. The bussed output circuit can be the same as the circuit 400 of FIG. 4 except that each of the output stages 410a-410n is replaced with an output stage 1000 shown in FIG. 10, which shows only one output stage for simplicity. Thus, the bussed output circuit can include first to n-th output stages, and a first node, the details of which can be as described above in connection with FIG. 4.

The illustrated output stage 1000 includes an NPN bipolar transistor 1011, a current source 1015, a first switch 1013, a second switch 1014, a first node 1017, a second node 1018, and an output stage node $N_{Oi}$, and is coupled to a voltage source 1016. In other embodiments, the transistor 1011 can be a PNP transistor.

Details of the bipolar transistor 1011 can be the same as those of the transistor 411a-411n of FIG. 4 except that the emitter of the transistor 1011 is coupled to the first node 1017, as shown in FIG. 10. Details of the first and second switches 1013, 1014 can be the same as those of the first and second switches 413a-413n, 414a-414n of FIG. 4 except that one end of the first switch 1013 is coupled to the second node 1018, as shown in FIG. 10.

The output stage 1000 can further include a first Schottky diode 1050, and a second Schottky diode 1060. The first and second Schottky diodes 1050, 1060 together serve to protect the base-emitter junction of the transistor 1011 from reverse bias damage. The anode of the second Schottky diode 1060 can be coupled to a second voltage reference 1020. Other details of the first and second Schottky diodes 1050, 1060 can be as described above in connection with the first and second Schottky diodes 650a, 660a, respectively, of FIG. 6A.

As described above in connection with FIG. 4, during operation, only one of the output stages is enabled while the other output stages are disabled. Detailed operation of the bussed output circuit can be as described above in connection with FIG. 4.

In the disabled output stages, the first switch 1013 is switched off, and the second switch 1014 is switched on to clamp the transistor 1011. Without the first and second Schottky diodes 1050, 1060, the reverse bias across the base-emitter junction of the transistor 1011 would be detrimental to the transistor 1011, as described above in connection with FIG. 4. However, the first and second Schottky diodes 1050, 1060 protect the transistor 1011 from reverse bias damage by providing a tolerable reverse bias voltage to the emitter of the transistor 1011.

In another embodiment, the output stage 1000 may include a PNP transistor in place of the NPN transistor 1011 of FIG. 9. In such an embodiment, the circuit of the output stage 1000 may be modified with the circuit 600B shown in FIG. 6B. In alternative embodiments, the output stage 1000 can use diode-connected transistors in place of the Schottky diodes 1050, 1060 of FIG. 10. In such embodiments, the circuit of the output stage 1000 can be modified with either of the circuits 800A, 800B of FIGS. 8A and 8B.

In the embodiments described above, the junction protection circuit, such as the Schottky diodes 650a, 650b, 660a, 660b, and the diode-connected transistors 850a, 850b, 860a, 860b, can effectively protect a semiconductor junction (for example, the base-emitter junction of a bipolar transistor) from reverse bias damage. Further, only a single protection device is added to a signal path during forward-biased operation. Thus, the protection circuit minimally reduces headroom for signal swing by, for example, about 0.5V. In certain cases, the protection circuit can be formed without adding substantial resistance, both small-signal (from device transconductance) and extrinsic (from parasitic resistance), that may degenerate the input or output stage, and reduce its gain. Such resistance may also be temperature-dependent, which may adversely affect the operation of the bipolar transistor. In addition, the protection can operate at low power while not greatly loading the circuit being protected.

Applications

A skilled artisan will appreciate that the configurations and principles of the embodiments can be adapted for any other semiconductor devices having a semiconductor junction. The circuits employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include video multiplexers and video switches. The consumer electronic products can include, but are not limited to, a mobile phone, cellular base stations, a telephone, a television, a computer monitor, a computer, a hand-held computer, a netbook, a tablet computer, a digital book, a personal digital assistant (PDA), a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a bipolar transistor comprising an emitter, a base, a collector, wherein the base of the bipolar transistor is configured to receive an input signal;
   a first junction protection device having a first end and a second end, wherein the first end is electrically coupled to the emitter of the bipolar transistor, and wherein the second end is electrically coupled to a node other than the base of the bipolar transistor;
   a second junction protection device having a first end and a second end, wherein the first end is electrically coupled to a voltage reference, and the second end is electrically coupled to the emitter of the bipolar transistor; and
   a switch configured to control a flow of current through the bipolar transistor, wherein when the switch is in a first state, the bipolar transistor is configured to amplify the input signal, and wherein when the switch is in a second state, the first and second junction protection devices are configured to operate as a voltage divider to control a voltage of the emitter of the bipolar transistor;
   wherein the first and second junction protection devices have substantially higher leakage currents than the leakage current of a base-emitter junction of the bipolar transistor when each is reverse biased.

2. The apparatus of claim 1, wherein each of the first and second junction protection devices has a reverse breakdown voltage greater than that of the base-emitter junction of the bipolar transistor.

3. The apparatus of claim 1, wherein the bipolar transistor is an NPN bipolar transistor, wherein the voltage reference is configured to provide a negative voltage.

4. The apparatus of claim 1, wherein the bipolar transistor is a PNP bipolar transistor, wherein the voltage reference is configured to provide a positive voltage.

5. The apparatus of claim 1, wherein the first junction protection device and the second junction protection device have substantially matched leakage currents when each is reverse biased.

6. The apparatus of claim 5, wherein the first junction protection device and the second junction protection device form the voltage divider when reverse-biased, wherein the voltage divider is configured to provide a reverse bias voltage that is tolerable by the p-n junction of the bipolar transistor.

7. The apparatus of claim 1, wherein the first junction protection device comprises one or more devices selected from a Schottky diode, a pn junction diode, or a diode-connected transistor, and the second junction protection device comprises one or more devices selected from a resistor, a Schottky diode, a pn junction diode, or a diode-connected transistor.

8. The apparatus of claim 1, wherein each of the first and second junction protection devices comprises one or more Schottky diodes.

9. The apparatus of claim 8, wherein the bipolar transistor is an NPN bipolar transistor, wherein the first junction protection device comprises a first Schottky diode having an anode electrically coupled to the emitter of the bipolar transistor, and a cathode electrically coupled to the node, wherein the second junction protection device comprises a second Schottky diode having an anode electrically coupled to the voltage reference, and a cathode electrically coupled to the emitter of the bipolar transistor.

10. The apparatus of claim 8, wherein the bipolar transistor is a PNP bipolar transistor, wherein the first junction protection device comprises a first Schottky diode having an anode electrically coupled to the node, and a cathode electrically coupled to the emitter of the bipolar transistor, wherein the second junction protection device comprises a second Schottky diode having an anode electrically coupled to the emitter of the bipolar transistor, and a cathode electrically coupled to the voltage reference.

11. The apparatus of claim 1, wherein each of the first and second junction protection devices is a diode-connected NPN bipolar transistor including a collector, an emitter, and a base, wherein the base is shorted to the emitter.

12. The apparatus of claim 11, wherein the bipolar transistor is an NPN bipolar transistor, wherein the first junction protection device is a first diode-connected NPN transistor having a base-emitter electrically coupled to the emitter of the bipolar transistor, and a collector electrically coupled to the node, wherein the second junction protection device is a second diode-connected NPN transistor having a base-emitter electrically coupled to the voltage reference, and a collector electrically coupled to the emitter of the bipolar transistor.

13. The apparatus of claim 11, wherein the bipolar transistor is a PNP bipolar transistor, wherein the first junction protection device is a first diode-connected NPN transistor having a base-emitter electrically coupled to the node, and a collector electrically coupled to the emitter of the bipolar transistor, wherein the second junction protection device is a second diode-connected NPN transistor having a base-emitter electrically coupled to the emitter of the bipolar transistor, and a collector electrically coupled to the voltage reference.

14. The apparatus of claim 1, wherein each of the first and second junction protection devices is a diode-connected PNP bipolar transistor including a collector, an emitter, and a base, wherein the base is shorted to the collector.

15. The apparatus of claim 14, wherein the bipolar transistor is an NPN bipolar transistor, wherein the first junction protection device is a first diode-connected PNP transistor having a collector electrically coupled to the emitter of the bipolar transistor, and a base-emitter electrically coupled to the node, wherein the second junction protection device is a second diode-connected PNP transistor having a collector electrically coupled to the voltage reference, and a base-emitter electrically coupled to the emitter of the bipolar transistor.

16. The apparatus of claim 14, wherein the bipolar transistor is a PNP bipolar transistor, wherein the first junction protection device is a first diode-connected PNP transistor having a collector electrically coupled to the node, and a base-emitter electrically coupled to the emitter of the bipolar transistor, wherein the second junction protection device is a second diode-connected PNP transistor having a collector electrically coupled to the emitter of the bipolar transistor, and a base-emitter electrically coupled to the voltage reference.

17. The apparatus of claim 1, wherein the bipolar transistor, the first junction protection device, and the second junction protection device form at least part of a half circuit of a differential circuit.

18. An electronic device comprising:
a plurality of circuits connected in parallel to one another, wherein each of the circuits comprises:
a first bipolar transistor including an emitter, a base, and a collector, wherein the base of the first bipolar transistor is configured to receive an input signal;
a first junction protection device including a first end electrically coupled to the emitter of the first bipolar transistor, and a second end electrically coupled to a node;
a second junction protection device including a first end electrically coupled to a first voltage reference, and a second end electrically coupled to the emitter of the first bipolar transistor; and
a switch configured to control a flow of current through the first bipolar transistor, wherein when the switch is in a first state, the first bipolar transistor is configured to amplify the input signal, and wherein when the switch is in a second state, the first and second junction protection devices are configured to operate as a voltage divider to control a voltage of the emitter of the first bipolar transistor;
wherein each of the first and second junction protection devices has a substantially higher leakage current than the leakage current of a p-n junction of the first bipolar transistor when reverse biased.

19. The device of claim 18, wherein the electronic device comprises a bussed output circuit, wherein each of the plurality of circuits forms an output stage of the output circuit, wherein the plurality of circuits are selectively enabled or disabled.

20. The device of claim 19, wherein each of the circuits further comprises a current source electrically connectable to the node via a first switch, and a voltage source electrically connectable to the base of the first bipolar transistor via a second switch.

21. The device of claim 18, wherein each of the first and second junction protection devices is a Schottky diode.

22. The device of claim 18, wherein each of the first and second junction protection devices is a diode-connected bipolar transistor having an emitter, and a base shorted to the emitter.

23. An electronic device comprising:
a plurality of circuits connected in parallel to one another, wherein each of the circuits comprises:
a first bipolar transistor including an emitter, a base, and a collector;
a first junction protection device including a first end electrically coupled to the emitter of the first bipolar transistor, and a second end electrically coupled to a node; and
a second junction protection device including a first end electrically coupled to a first voltage reference, and a second end electrically coupled to the emitter of the first bipolar transistor;
wherein each of the first and second junction protection devices has a substantially higher leakage current than the leakage current of a p-n junction of the first bipolar transistor when reverse biased,
wherein the electronic device comprises a multiplexer circuit, wherein each of the plurality of circuits forms an input stage of the multiplexer circuit, wherein the plurality of circuits are selectively enabled or disabled for multiplexing.

24. The device of claim 23, wherein each of the circuits further comprises:
a second bipolar transistor including an emitter, a base, and a collector;
a third junction protection device including a first end electrically coupled to the emitter of the second bipolar transistor, and a second end electrically coupled to the node; and
a fourth junction protection device including a first end electrically coupled to a second voltage reference, and a second end electrically coupled to the emitter of the second bipolar transistor;
wherein each of the third and fourth junction protection devices has a substantially higher leakage current than the leakage current of a p-n junction of the second bipolar transistor when reverse biased.

25. The device of claim 24, wherein each of the circuits further comprises:
a current source electrically connectable to the node via a first switch, and a voltage source electrically connectable to the node via a second switch.

26. A method comprising:
applying a first voltage to a first node, and a second voltage to a second node, thereby reverse-biasing a p-n junction of a bipolar transistor electrically coupled between the first and second nodes, wherein a base of the bipolar transistor is configured to receive an input signal;
generating a first leakage current through a first junction protection device electrically coupled between the first node and the p-n junction, wherein the first leakage current is substantially higher than a leakage current through the p-n junction;

generating a second leakage current through a second junction protection device electrically coupled between the p-n junction and a voltage reference, wherein the second leakage current is substantially higher than the leakage current through the p-n junction; and controlling a flow of current through the bipolar transistor using a switch, wherein when the switch is in a first state, the bipolar transistor is configured to amplify the input signal, and wherein when the switch is in a second state, the first and second junction protection devices are configured to operate as a voltage divider to control a voltage of an emitter of the bipolar transistor.

27. The method of claim 26, further comprising:

providing a third voltage to the p-n junction from a third node between the first and second junction protection devices such that a difference between the third voltage and the second voltage is a reverse bias voltage that does not damage the p-n junction.

28. The method of claim 27, wherein the difference is less than 2 volts.

29. The method of claim 26, wherein each of the first and second junction protection devices is a Schottky diode or a diode-connected bipolar transistor having an emitter, and a base shorted to the emitter.

* * * * *